US011196146B2

(12) United States Patent
Moallem et al.

(10) Patent No.: US 11,196,146 B2
(45) Date of Patent: Dec. 7, 2021

(54) GROUNDED BGA WAVE-GUIDING INTERFACE BETWEEN AN ON-PACKAGE SIGNAL LAUNCH AND AN EXTERNAL WAVEGUIDE

(71) Applicant: TEXAS INSTRUMENTS INCORPORATED, Dallas, TX (US)

(72) Inventors: Meysam Moallem, Plano, TX (US); Brian P. Ginsburg, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/853,814

(22) Filed: Apr. 21, 2020

(65) Prior Publication Data

US 2020/0365971 A1    Nov. 19, 2020

Related U.S. Application Data

(60) Provisional application No. 62/847,422, filed on May 14, 2019.

(51) Int. Cl.
*H01Q 1/24* (2006.01)
*H01Q 13/06* (2006.01)
*H01P 3/00* (2006.01)

(52) U.S. Cl.
CPC .................................. *H01Q 1/243* (2013.01)

(58) Field of Classification Search
CPC ........ H01Q 1/24; H01Q 1/243; H01Q 1/2283; H01Q 1/521; H01Q 13/06; H01Q 23/00;
(Continued)

(56) References Cited

U.S. PATENT DOCUMENTS

2007/0040626 A1* 2/2007 Blair ..................... H01P 3/006
333/1
2013/0265732 A1* 10/2013 Herbsommer ....... G02B 6/1228
361/774
(Continued)

FOREIGN PATENT DOCUMENTS

JP      2018-148105 A      9/2018
JP      2018148105 A  *   9/2018

OTHER PUBLICATIONS

PCT International Search Report; PCT/US 2020/032312; dated Aug. 6, 2020; 2 pages.

*Primary Examiner* — Thai Pham
(74) *Attorney, Agent, or Firm* — Ebby Abraham; Charles A. Brill; Frank D. Cimino

(57) ABSTRACT

A device comprises a package substrate and a ball grid array (BGA). The package substrate encapsulates an integrated circuit (IC) die and comprises a signal launch configured to emit or receive a signal on a surface of the package substrate. The BGA is affixed to the surface and comprises a set of grounded solder balls arranged as a boundary around the signal launch. The device may further comprise a printed circuit board (PCB) substrate having a waveguide interface side opposite a secondary waveguide side and a through-hole cavity that extends from the waveguide interface side to the secondary waveguide side, perpendicular to a plane of the PCB substrate. The BGA couples the package substrate to the waveguide interface side such that the surface of the package substrate faces the through-hole cavity and the signal launch and through-hole cavity are substantially aligned.

20 Claims, 9 Drawing Sheets

(58) Field of Classification Search
CPC .... H01P 3/00; H01P 3/121; H01P 5/00; H01P 5/107
See application file for complete search history.

(56) References Cited

U.S. PATENT DOCUMENTS

| | | |
|---|---|---|
| 2015/0364830 A1* | 12/2015 | Tong ........................ H01L 23/66 342/27 |
| 2018/0247905 A1* | 8/2018 | Yu .......................... H01L 21/565 |
| 2019/0101636 A1* | 4/2019 | Trotta ...................... G01S 13/88 |
| 2019/0346814 A1 | 11/2019 | Fruehling et al. |
| 2020/0021002 A1* | 1/2020 | Wojnowski ............... H01P 3/16 |

* cited by examiner

GROUNDED BGA WAVE-GUIDING INTERFACE BETWEEN AN ON-PACKAGE SIGNAL LAUNCH AND AN EXTERNAL WAVEGUIDE

CROSS-REFERENCE TO RELATED APPLICATIONS

This application claims priority to U.S. Provisional Application No. 62/847,422, filed May 14, 2019, which is hereby incorporated by reference.

BACKGROUND

High frequency integrated circuits (ICs) generate millimeter wave signals such as those used for automotive radar, from approximately 76 GigaHertz (GHz) to 81 GHz. In conventional IC packaging, these signals are transitioned to planar transmission lines on a printed circuit board (PCB), for example through a ball grid array (BGA). Planar transmission lines carry the signal from one location on the PCB to another, such as from a signal ball pad to an external waveguide launch. The external waveguide can be used to feed a three-dimensional (3D) antenna. However, routing high frequency signals through planar transmission lines increases the complexity and cost of manufacturing the PCB and often results in signal power loss. Some ICs use a direct interface between the packaged device and external waveguides, rather than planar transmission lines. However, direct interfaces must have low coupling losses and high isolation between signal channels and be robust to manufacturing and assembly tolerances.

SUMMARY

An example device includes a package substrate and a BGA. The package substrate encapsulates an IC die and comprises a signal launch on the surface of the package substrate that is configured to emit or receive a signal. The BGA is affixed to the surface of the package substrate and comprises a set of grounded solder balls arranged as a boundary around the signal launch on the surface of the package substrate. Some implementations also include a PCB substrate having a waveguide interface side, a secondary waveguide side opposite the waveguide interface side, and a through-hole cavity perpendicular to a plane of the PCB substrate and extending from the waveguide interface side to the secondary waveguide side. The BGA couples the package substrate to the waveguide interface side such that the surface of the package substrate faces the through-hole cavity and such that the signal launch and the through-hole cavity are substantially aligned.

In some examples, the set of grounded solder balls forms a wave-guiding interface between the signal launch and the through-hole cavity. In some implementations, the device further comprises an external waveguide coupled to the secondary waveguide side of the PCB substrate such that the external waveguide and the through-hole cavity are substantially aligned. The external waveguide is included in a 3D antenna in some implementations. The set of grounded solder balls is arranged as a circular boundary around the signal launch and the through-hole cavity in some examples, and arranged as a rectangular boundary in other examples.

In some implementations, the signal launch is a first signal launch configured to emit or receive a first signal, and the set of grounded solder balls comprises a first set of grounded solder balls arranged as a boundary around the first signal launch. The package substrate further comprises a second signal launch on the surface of the package substrate that is configured to emit or receive a second signal, and the BGA further comprises a second set of grounded solder balls arranged as a boundary around the second signal launch on the surface of the package substrate. The first and second sets of grounded solder balls have at least one grounded solder ball in common in some examples, and none in common in other examples. The first and second sets of grounded solder balls are arranged such that the first and second signals are isolated from each other by a threshold amount in some implementations.

BRIEF DESCRIPTION OF THE DRAWINGS

For a detailed description of various examples, reference will now be made to the accompanying drawings in which.

DETAILED DESCRIPTION

The disclosed IC chips provide an interface to external waveguides that is robust to manufacturing and assembly tolerances and offer high isolation and low insertion losses. The disclosed IC chips include a radar device with a waveguide interface comprising an integrated signal launch on the package encapsulating the IC chip and grounded solder balls arranged as a fence around the signal launch on the surface of the package. The grounded solder balls isolate the signal launch and its received or transmitted signals from adjacent signal channels and improve insertion loss between the signal launch and external waveguides to which the IC chip can be coupled. The grounded solder balls can be included in a BGA affixed to the package encapsulating the radar device.

In some examples, the disclosed devices include a PCB substrate having first and second surfaces opposite each other and a substrate waveguide between the first and second surface, substantially orthogonal to the plane of the PCB substrate. The grounded solder balls couple the package encapsulating the radar device to the first surface of the PCB substrate such that the surface of the package faces the first surface and such that the signal launch and the substrate waveguide are substantially aligned. An external waveguide or an external antenna having a waveguide opening can be coupled to the second surface of the PCB substrate. The waveguide interface, the substrate waveguide, and the external waveguide or waveguide opening form a signal channel between the signal launch and the external antenna.

Figure 1:
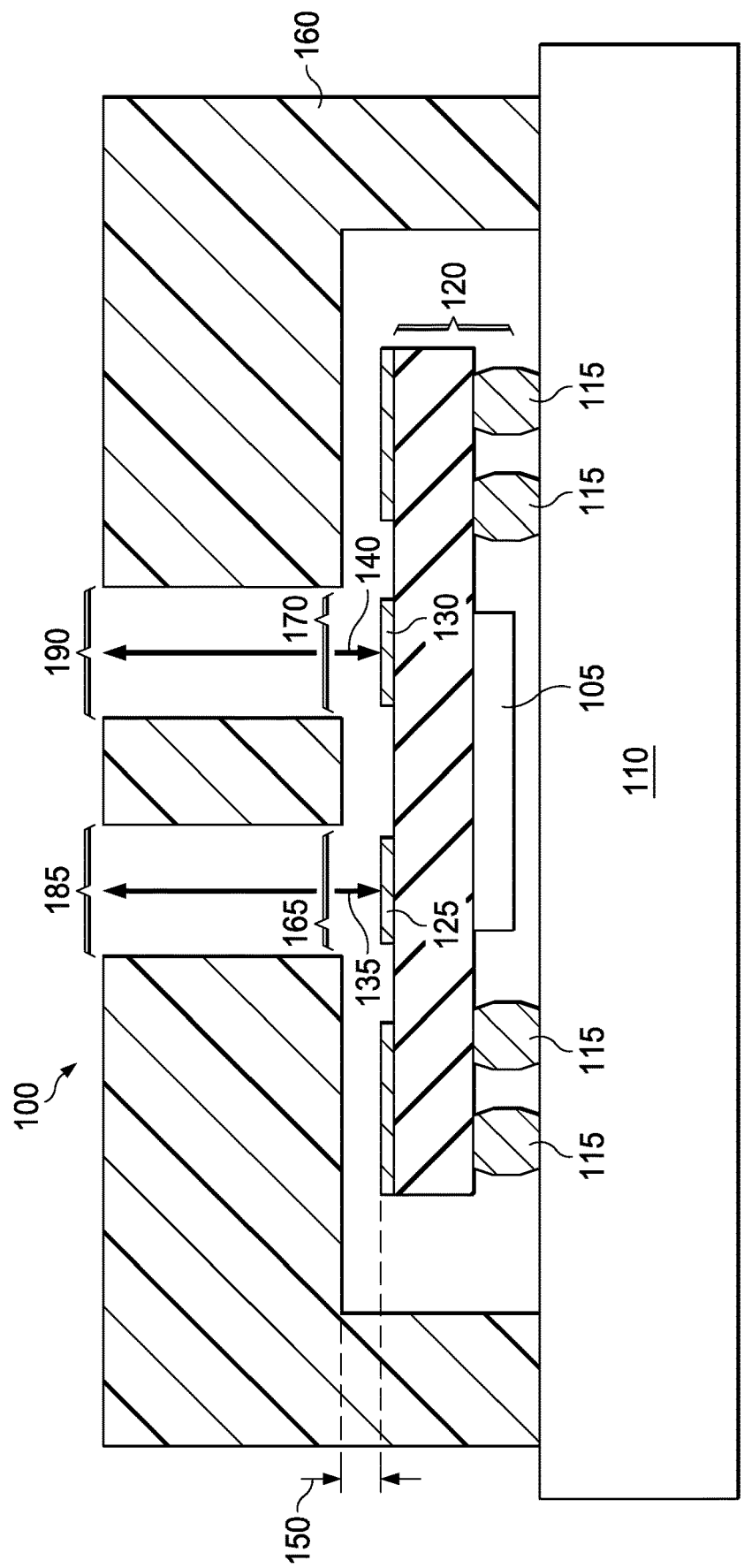
FIG. 1 illustrates a direct interface between a packaged radar device, a waveguide, and a 3D antenna.

FIG. 1 illustrates a direct interface between a packaged radar device and a 3D antenna with waveguide feeds. The package-to-waveguide interface 100 includes a packaged radar device 120 coupled to a PCB substrate 110 by an array of solder balls 115, and a 3D antenna 160 with waveguide feeds. The 3D antenna 160 is placed on PCB substrate 110 over and around packaged radar device 120, separated from packaged radar device 120 by a gap 150. The packaged radar device 120 includes an IC die 105 and signal launches 125 and 130, which emit and/or receive signals to and from 3D antenna 160. Waveguide openings 185 and 190 reroute, fan out, split, and the like to other parts of 3D antenna 160 based on the particular antenna design. The rerouting, fanning out, splitting, and the like are not shown here, and do not impact the interface between waveguide openings 165 and 170 and signal launches 125 and 130 on packaged radar device 120. Only the waveguide openings 185 and 190 of 3D antenna 160 are shown here; other portions of 3D antenna 160 are omitted for ease of explanation.

Signal launch 125 emits signals to and/or receives signals from waveguide opening 185 in 3D antenna 160 through signal channel 135. The signal channel 135 is made up of gap 150 and waveguide opening 165. Signal launch 130 emits signals to and/or receives signals from waveguide opening 190 in 3D antenna 160 through signal channel 140. The signal channel 140 is made up of gap 150 and waveguide opening 170. The width of gap 150 varies due to manufacturing and assembly tolerances, for example due to changes in the height of the solder balls 115 in the BGA coupling the packaged radar device 120 to PCB substrate 110.

Variations in the width of gap 150 can have significant effects on the performance of the package-to-waveguide interface 100. Isolation between adjacent signal launches 125 and 130 decreases as the width of gap 150 increases, causing a signal from one signal launch to leak from its signal channel to another signal channel and interfere with signals through adjacent signal channels. Similarly, the insertion loss for the signal channels increases as the width of gap 150 increases, degrading signal integrity through the signal channels.

Figure 2:
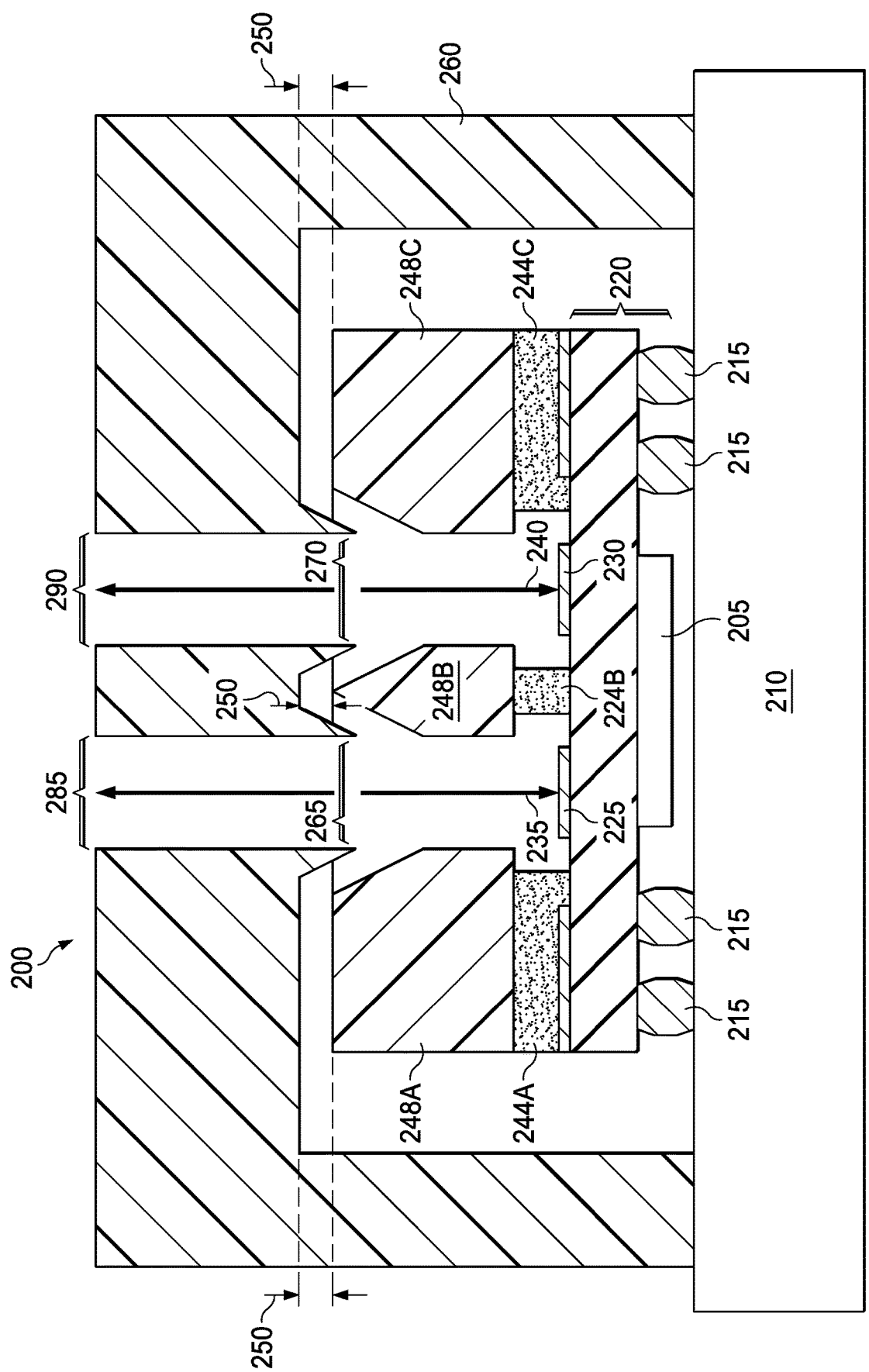
FIG. 2 illustrates another direct interface between a packaged radar device, a waveguide, and a 3D antenna.

FIG. 2 illustrates another direct interface between a packaged radar device and a 3D antenna with waveguide feeds. The package-to-waveguide interface 200 is similar to package-to-waveguide interface 100 shown in FIG. 1, but 3D antenna 260 is separated from packaged radar device 220 by interposers 248A-C. During manufacturing, a layer of the interposing material is glued to packaged radar device 220, and both the glue and the interposing material are selectively removed from over antenna launches 225 and 230. The resulting sections of glue 244A-C and interposers 248A-C are separated from 3D antenna 260 by a gap 250.

Although the interposers 248A-C reduce the impact of variability on performance somewhat, the width of gap 250 can still vary enough to affect the performance of PCB 200, specifically the isolation between signal channels 235 and 240 and insertion losses for each signal channel. The additional manufacturing steps to glue the interposing material to the packaged radar device 220 and selectively remove the glue and interposing material over antenna launches 225 and 230 as well as the complex assembly to align antenna launches 225 and 230, interposers 248A-C, and waveguide openings 265 and 270 increase the manufacturing cost for package-to-waveguide interface 200.

Figure 3:
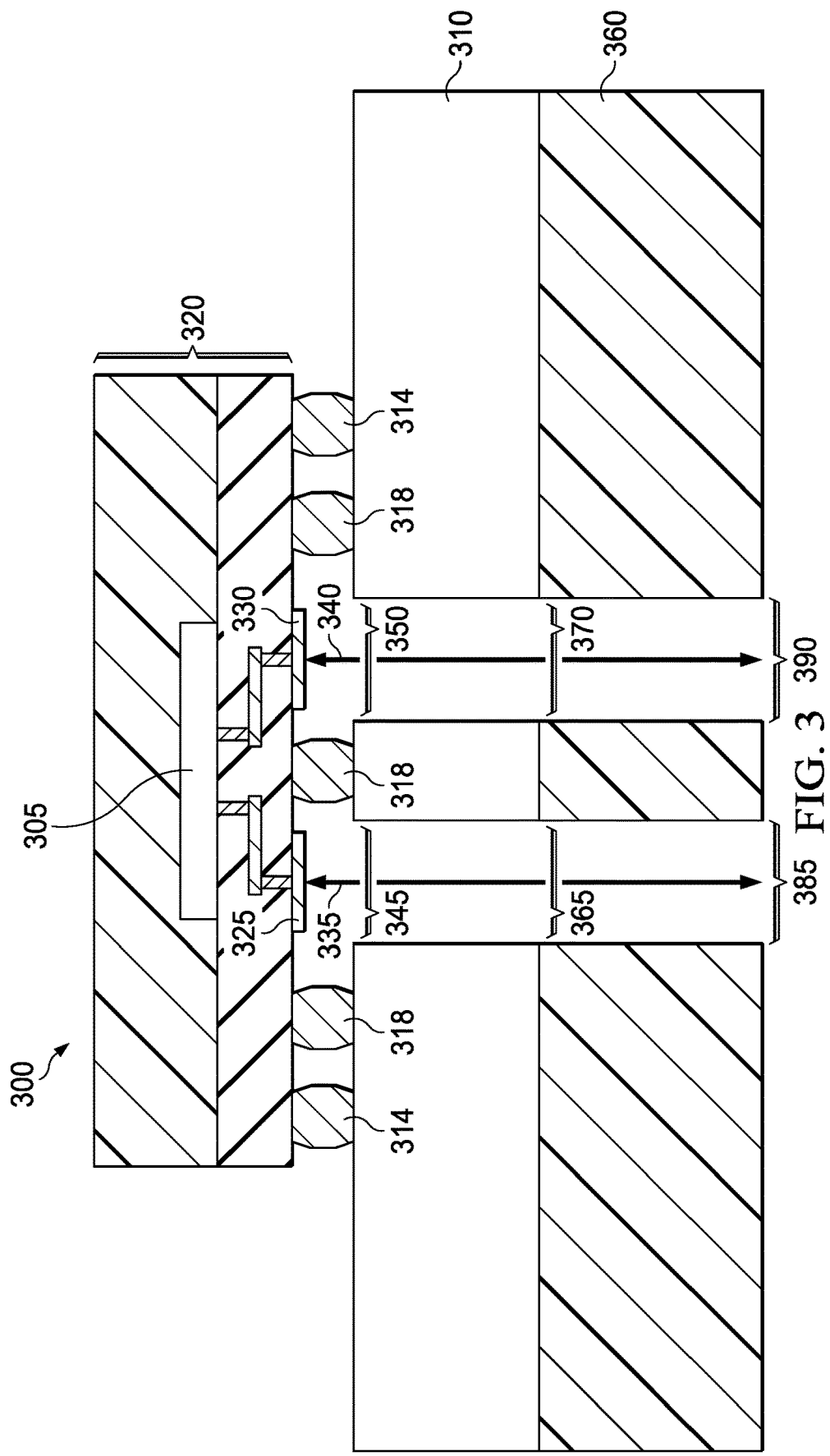
FIG. 3 illustrates an example direct interface between a packaged radar device and a 3D antenna through a waveguide interface and printed circuit board through-holes.

FIG. 3 illustrates an example direct interface between a packaged radar device and a 3D antenna through a waveguide interface and PCB through-holes. Package-to-waveguide interface 300 includes a packaged radar device 320 coupled to a waveguide interface side of a PCB substrate 310 by an array of solder balls 314 and 318. A 3D antenna 360 is coupled to the opposite, secondary waveguide side of PCB substrate 310 from the packaged radar device 320. There are no gaps between packaged radar device 320, PCB substrate 310, and 3D antenna 360. Waveguide openings 385 and 390 reroute, fan out, split, and the like to other parts of 3D antenna 360 based on the particular antenna design. The rerouting, fanning out, splitting, and the like are not shown here, and do not impact the interface between waveguide openings 365 and 370 and signal launches 325 and 330 on packaged radar device 320. Only the waveguide openings 385 and 390 of 3D antenna 360 are shown here; other portions of 3D antenna 360 are omitted for ease of explanation.

Packaged radar device 320 includes an IC die 305 and signal launches 325 and 330. As used herein, the package encapsulating IC die 305 includes a package substrate on which the IC die 305 is mounted. In the case of top-mounted flip chip BGA packaging, the IC die 305 is mounted on top of the package substrate and a mold compound covers the top and side of the IC die 305 and a portion of the package substrate. The mold compound may be a plastic, ceramic, resin, or other appropriate material for encapsulating the IC die 305. In the case of under-mounted flip chip BGA packaging, shown in FIGS. 1 and 2, the IC die 305 is mounted on the bottom side of the package substrate, the same side as the BGA, and is left exposed; no mold compound is used.

Signal launch 325 is substantially aligned with the waveguide opening 385 of 3D antenna 360 and emits and/or receives signals through signal channel 335. The signal channel 335 is made up of solder balls 318, PCB through-hole 345, and waveguide opening 365 in 3D antenna 360. Signal launch 330 is substantially aligned with the waveguide opening 390 of 3D antenna 360 and emits and/or receives signals through signal channel 340. The signal channel 340 is made up of solder balls 318, PCB through-hole 350, and waveguide opening 370 in 3D antenna 360. The BGA package for radar device 320 includes open spaces over antenna launches 325 and 330, without solder balls. Solder balls 318 around antenna launches 325 and 330 are grounded and act as a wave-guiding structure between the signal launches 325 and 330 and the PCB through-holes 345 and 350.

The wave-guiding structures comprising solder balls 318 isolate signal channels 335 and 340 from each other and other adjacent signal channels and improve impedance matching between signal launches 325 and 330 and 3D antenna 360. Solder balls 318 also decrease insertion loss between signal launches 325 and 330 and waveguide openings 385 and 390 of 3D antenna 360. Because solder balls 318 act as a wave guiding structure between packaged radar device 320 and PCB substrate 310, which is directly connected to the waveguide feeds of 3D antenna 360, the performance of package-to-waveguide interface 300 does not vary significantly based on the width of a gap between the packaged radar device 320 and 3D antenna 360. PCB 300 also does not include additional components like interposers 248A-C and can be made without additional manufacturing steps such as gluing on an interposing material and selectively removing the glue and interposing materials over the antenna launches.

Figure 4A:
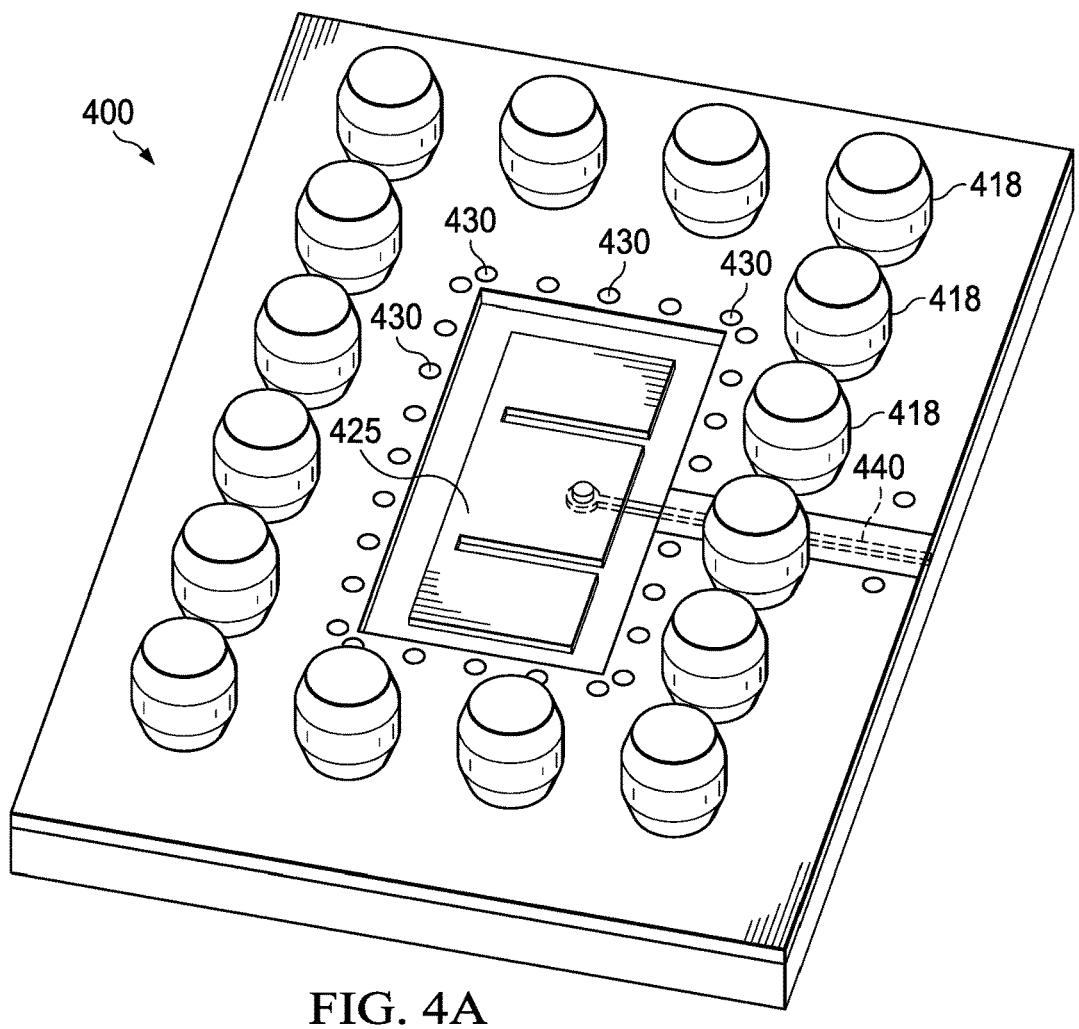
FIGS. 4A-D illustrate angled and side views of an example signal launch included in an IC chip package configured to interface with a 3D antenna directly, as well as a simulation plot of a signal through the direct interface and a plot illustrating insertion loss and return loss for the direct interface.

FIGS. 4A-D illustrate angled top and side views of an example signal launch included in an integrated circuit (IC) chip package configured to interface with a 3D antenna directly, as well as a simulation plot of a signal through the direct interface and a plot illustrating insertion loss and return loss for the direct interface. FIG. 4A illustrates an angled top view of the example IC package 400, which includes an "E" shaped signal launch 425. A signal trace 440 carries a signal to signal launch 425. Grounded vias 430 create a substrate-integrated cavity around the launch which improves isolation between signal launch 425 and other launches and components on the IC package 400. Grounded solder balls 418 on the surface of IC package 400 are arranged as a boundary around signal launch 425 and are configured to couple the IC package 400 to a PCB substrate.

Figure 4B:
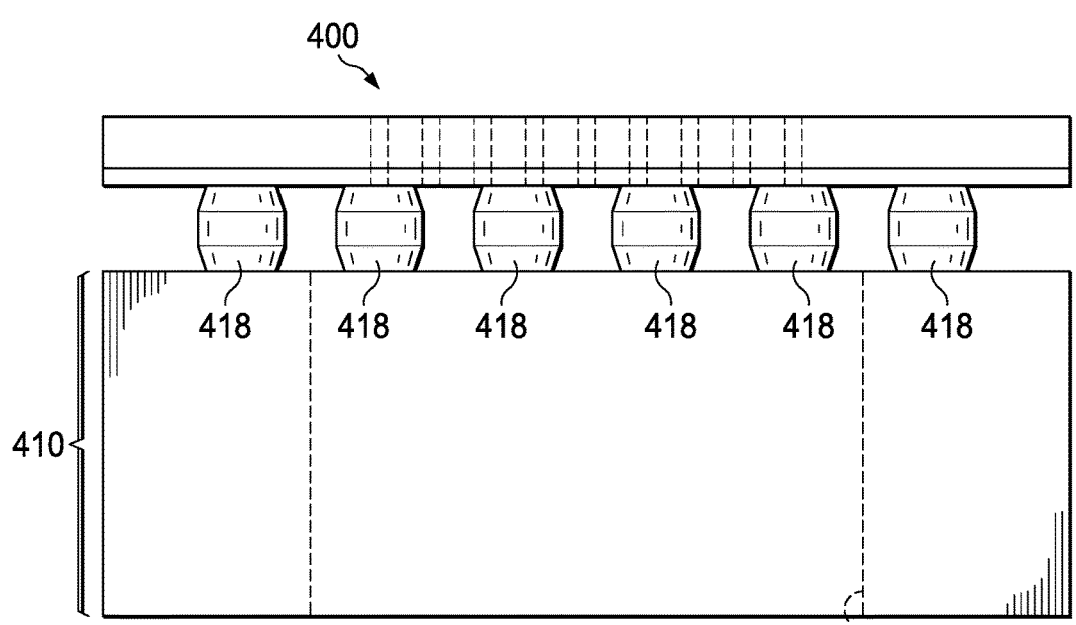
Figure 4C:
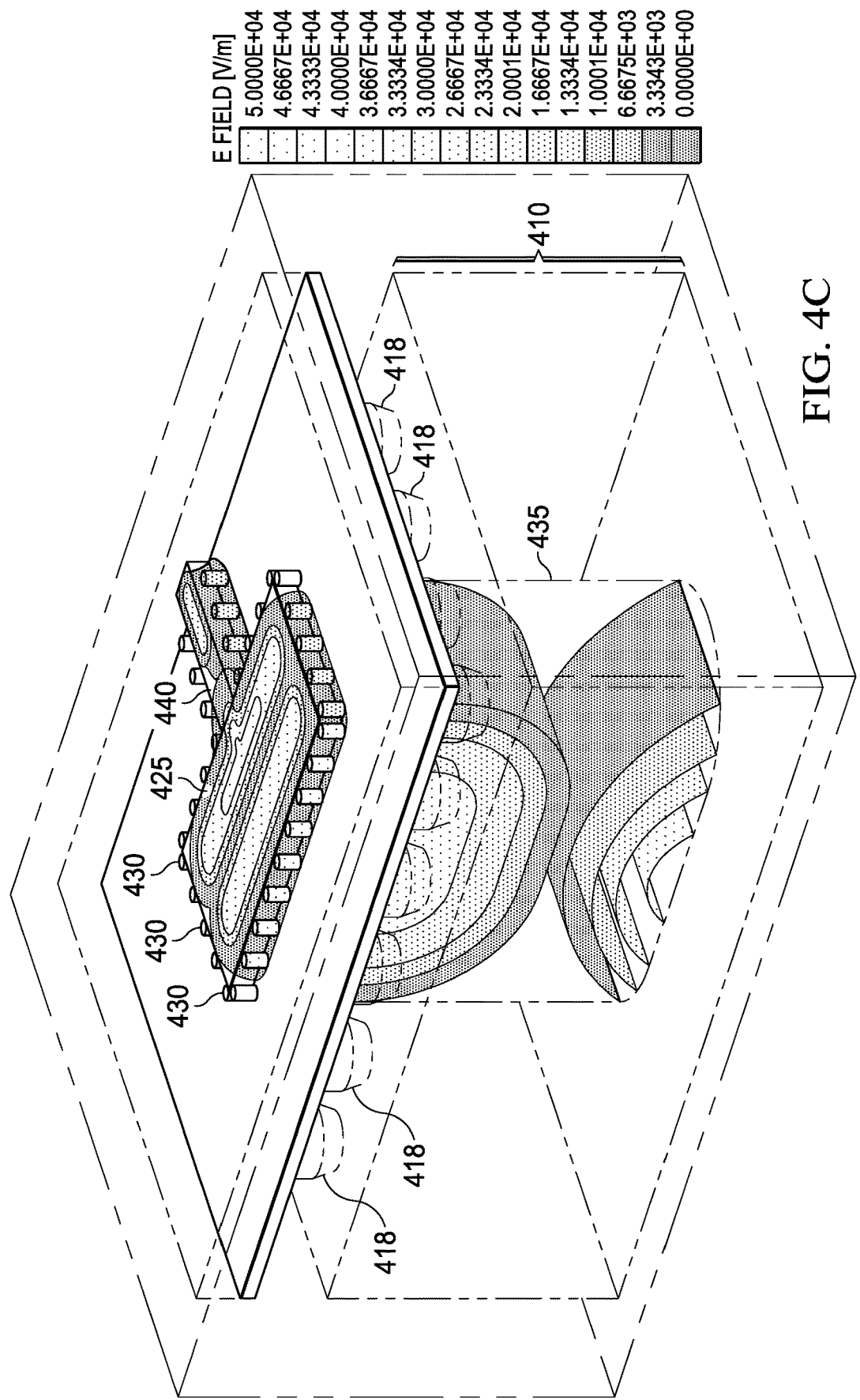

FIG. 4B illustrates a side view of the example IC package 400 coupled to a PCB substrate 410. The grounded solder balls 418 and signal launch 425 are aligned with a PCB through-hole cavity 435 which acts as a waveguide through the PCB substrate 410. During manufacturing and assembly, the grounded solder balls 418, the through-hole cavity 435, and antenna launch 425 are aligned. FIG. 4C shows a simulation plot of a signal through the grounded solder balls 418 and through-hole cavity 435. The field strength of the electromagnetic wave is indicated by the shaded regions. The electromagnetic field plot shows a well-matched transition from signal launch 425 to PCB through-hole cavity 435 with very little signal leakage in the IC package 400 or the region between the packaged radar device and the PCB coupled by the grounded solder balls 418.

Figure 4D:
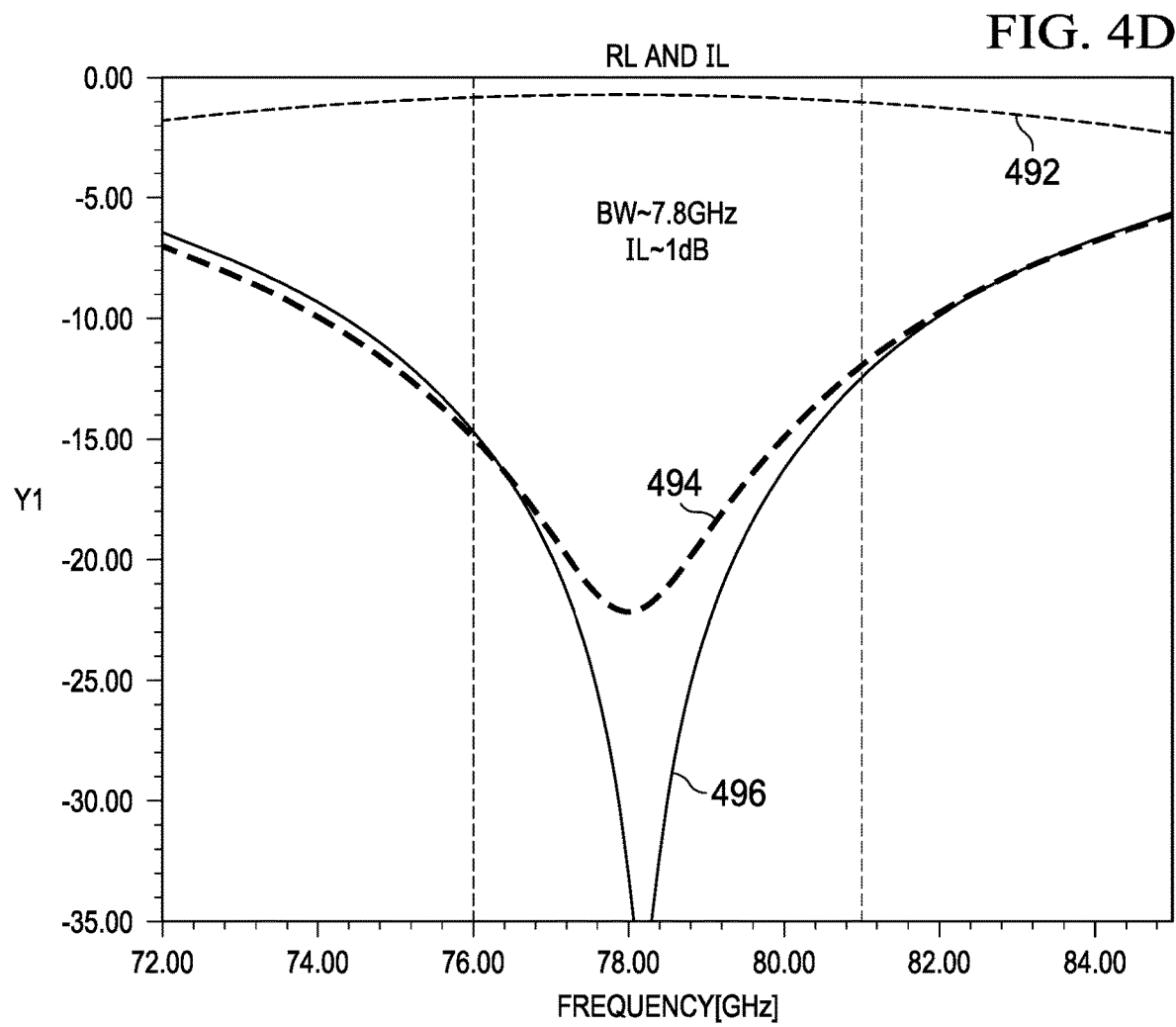

The waveguide interface formed by grounded solder balls 418 around signal launch 425 contains the signal and reduces signal leakage between the signal launch 425 and PCB through-hole cavity 435. FIG. 4D shows a plot of insertion loss 492, return loss on the antenna side 494, and return loss on the waveguide side 496 in decibels (dB) across a frequency range of 72-84 GHz. The direct interface shown in FIG. 4B produces an insertion loss of approximately one dB and a bandwidth of approximately 7.8 GHz.

Figure 5A:
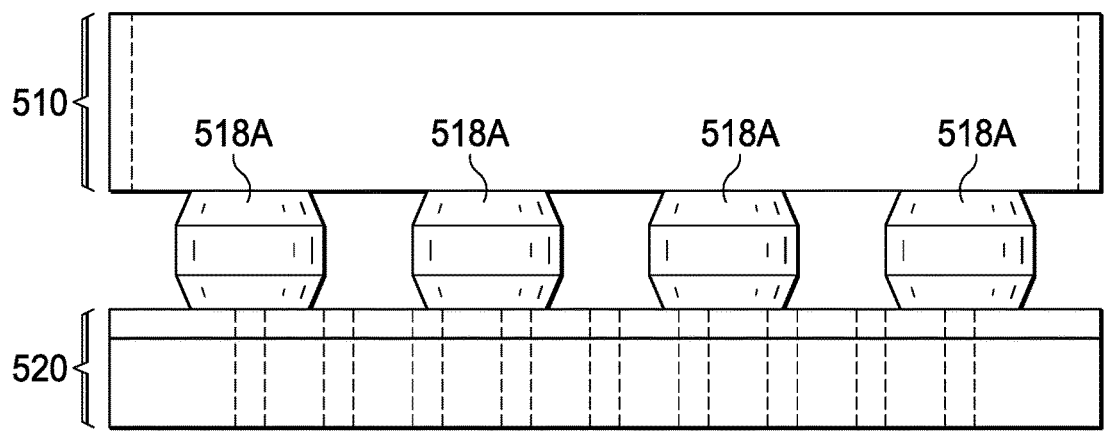
FIGS. 5A-C illustrate side views of example direct interfaces between a packaged radar device and a 3D antenna with variations in grounded solder ball height, as well as a plot illustrating insertion loss and return loss for differing grounded solder ball heights.
Figure 5B:
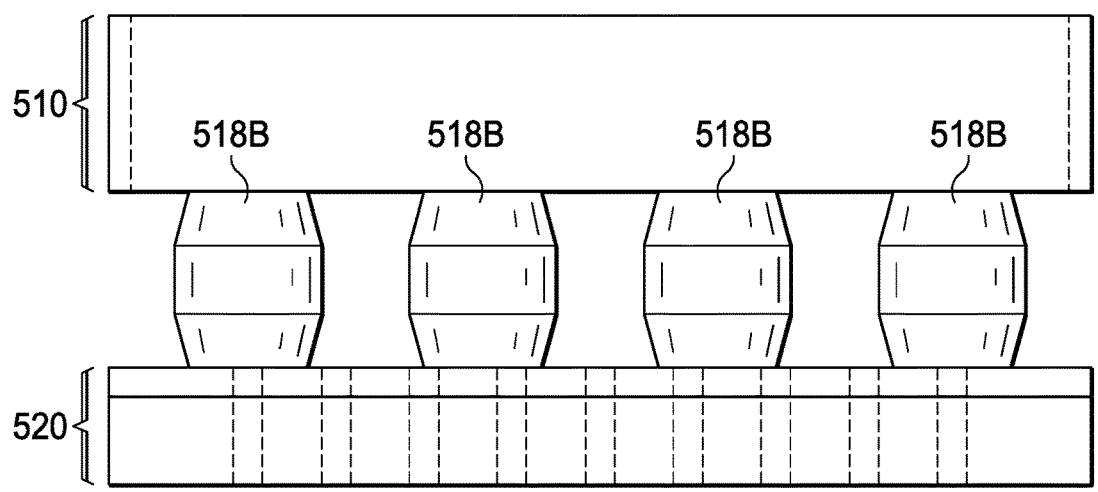
Figure 5C:
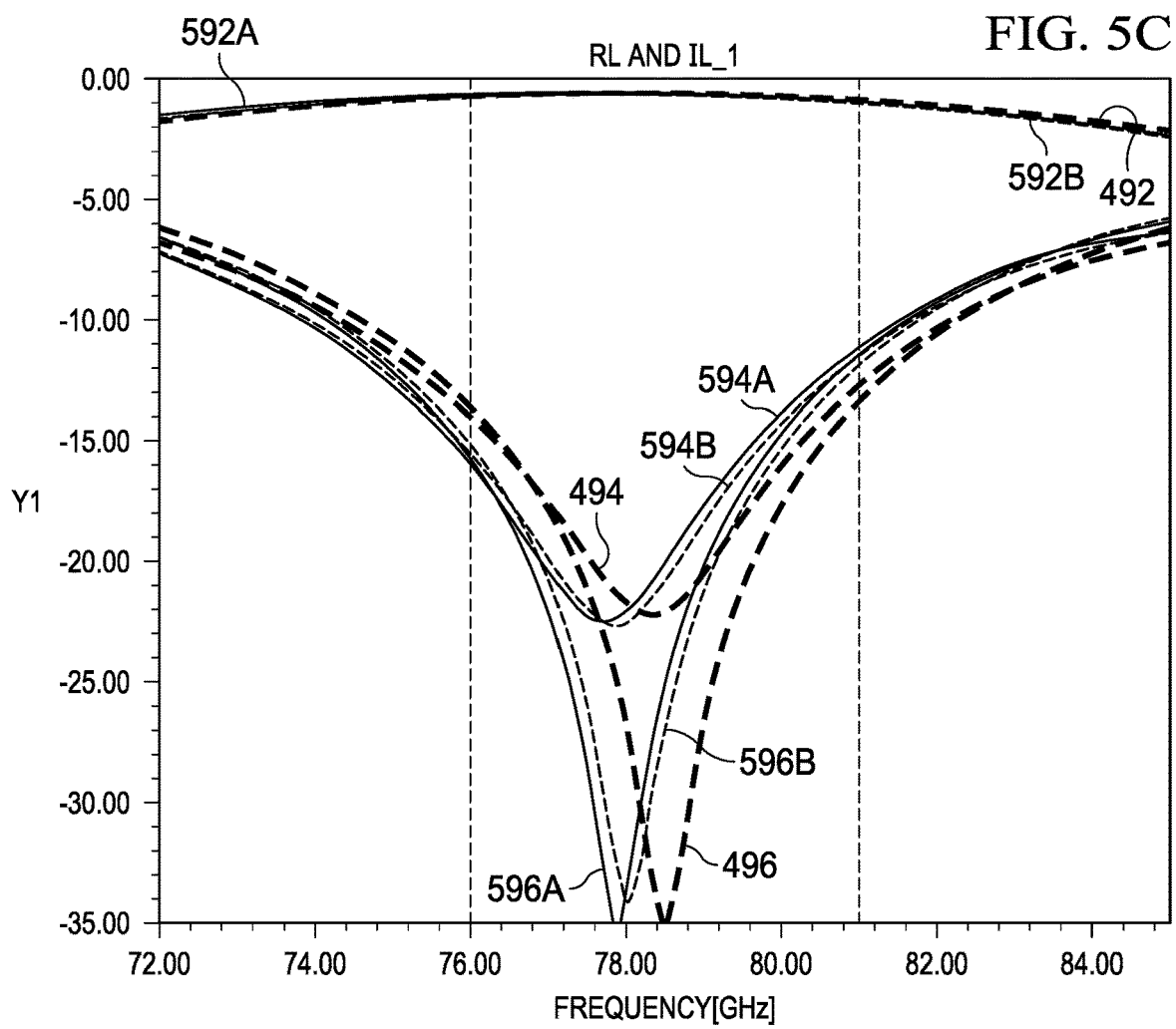

FIGS. 5A-C illustrate side views of example direct interfaces between a packaged radar device and a 3D antenna with variations in grounded solder ball height, as well as a plot illustrating insertion loss and return loss for differing grounded solder ball heights. FIG. 5A illustrates an example direct interface 500A with an IC package 510 coupled to a PCB substrate 520 by grounded solder balls 518A, which have a height that is 20% shorter than the height of grounded solder balls 418 shown in FIGS. 4A-B. FIG. 5B illustrates an example direct interface 500B with the IC package 510 coupled to the PCB substrate 520 by grounded solder balls 518B, which have a height that is 20% taller than the height of grounded solder balls 418 shown in FIGS. 4A-B. The variations in height between grounded solder balls 418, 518A, and 518B illustrate possible manufacturing variations for the grounded solder balls.

FIG. 5C shows a plot of insertion loss 492, return loss on the antenna side 494, and return loss on the waveguide side 496 from FIG. 4D with insertion loss 592A, return loss on the antenna side 594A, and return loss on the waveguide side 596A for the direct interface 500A shown in FIG. 5A and the insertion loss 592B, return loss on the antenna side 594B, and return loss on the waveguide side 596B for the direct interface 500B shown in FIG. 5B. As the overlapping plots illustrate, the variations in height between grounded solder balls 418, 518A, and 518B do not substantially affect the insertion loss or bandwidth of the direct interfaces.

Figure 6A:
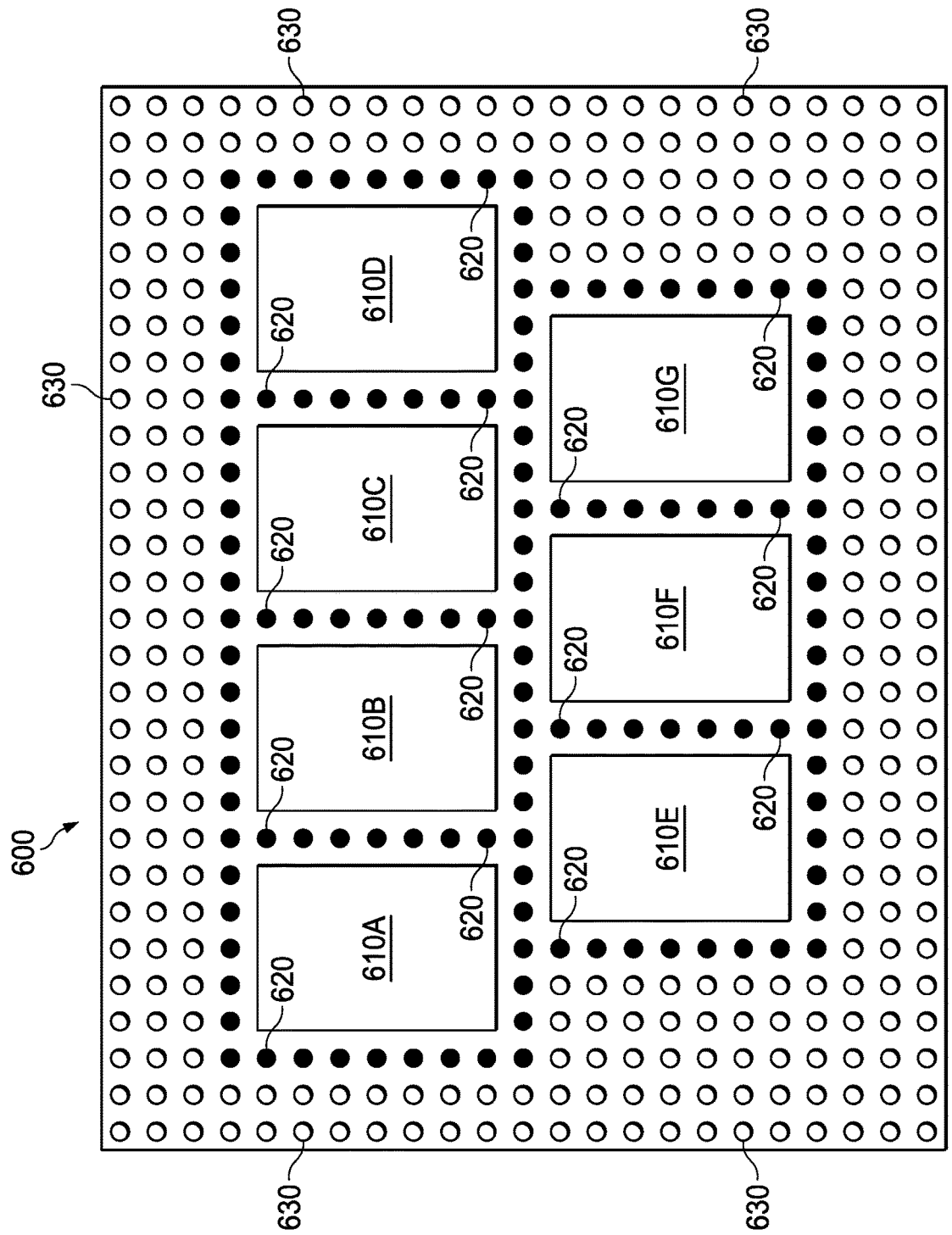
FIGS. 6A-B illustrate example layouts of packaged radar devices and grounded solder balls.
Figure 6B:
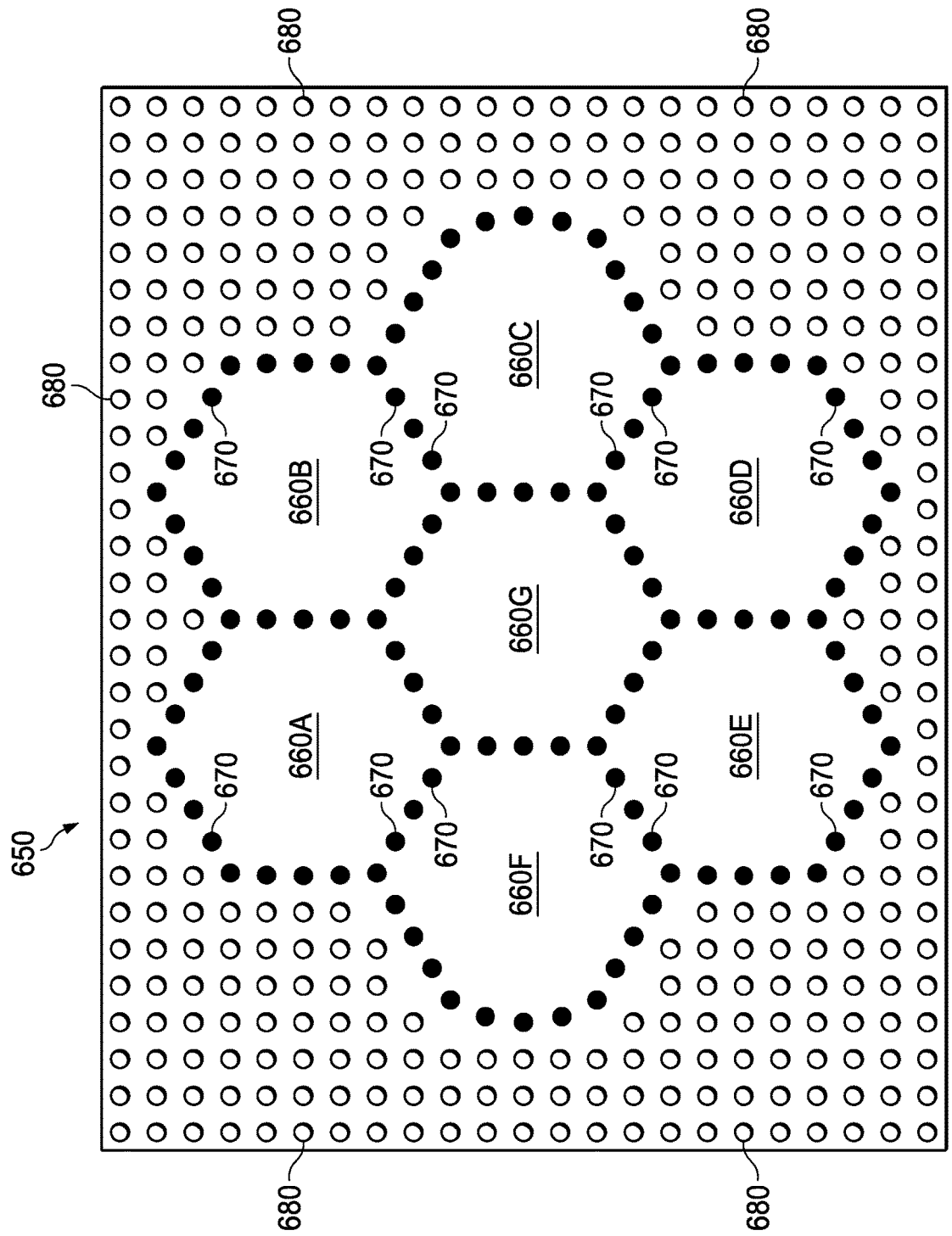

FIGS. 6A-B illustrate example layouts of packaged radar devices and grounded solder balls. A packaged radar device can include any number of signal launches with a variety of shapes and arrangements. FIG. 6A illustrates an example layout 600 of rectangular signal launches 610A-G and grounded solder balls 620 around each signal launch. Signal launches 610A-G are arranged close together, such that some grounded solder balls 620 are included in the boundaries around multiple signal launches. Solder balls 630 are included in a BGA package for an IC chip comprising antenna launches 610A-G and can be grounded or carry signals. Both grounded solder balls 620 and solder balls 630 are configured to couple the IC die to a PCB substrate.

FIG. 6B illustrates an example layout 650 of signal launches 660A-G and grounded solder balls 670 arranged in a circular boundary around each signal launch. Circular boundaries can be used for designs with circular PCB through-hole cavities. In layout 650, signal launches 660A-G can be circular or rectangular shaped. Grounded solder balls 670 are arranged in a circular shape around each signal launch, such that the shape of cross sections of the corresponding signal channels is defined by the grounded solder balls 670 fencing in the transmitted or received signal around the signal launches 660A-G. Similar to layout 600 shown in FIG. 6A, grounded solder balls 670 can be shared between boundaries around multiple signal launches 660A-G, and are included with solder balls 680 in a BGA package for an IC die comprising signal launches 660A-G and configured to couple the IC die to a PCB substrate.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Unless otherwise stated, in this description, "aligned" or "substantially aligned" means the two are ninety percent or more aligned with each other.

Modifications are possible in the described embodiments, and other embodiments are possible, within the scope of the claims.

What is claimed is:

1. A device, comprising:
   a package substrate encapsulating an integrated circuit (IC) die and comprising a first signal launch on a surface of the package substrate and configured to emit or receive a first signal, and a second signal launch on the surface of the package substrate and configured to emit of receive a second signal; and
   a ball grid array (BGA) affixed to the surface of the package substrate and comprising a first set of grounded solder balls arranged as a boundary around the first signal launch on the surface of the package substrate, and a second set of grounded solder balls arranged as a boundary around the second signal launch on the surface of the package substrate.

2. The device of claim 1, further comprising a printed circuit board (PCB) substrate having:
   a waveguide interface side;
   a secondary waveguide side opposite the waveguide interface side; and a through-hole cavity perpendicular to a plane of the PCB substrate and extending from the waveguide interface side to the secondary waveguide side, wherein the BGA couples the package substrate to the waveguide interface side such that the surface of the package substrate faces the through-hole cavity and such that the first signal launch and the through-hole cavity are substantially aligned.

3. The device of claim 2, wherein the first set of grounded solder balls forms a wave-guiding interface between the first signal launch and the through-hole cavity.

4. The device of claim 2, further comprising an external waveguide coupled to the secondary waveguide side such that the external waveguide and the through-hole cavity are substantially aligned.

5. The device of claim 4, wherein the external waveguide is included in a three-dimensional antenna.

6. The device of claim 2, wherein the first set of grounded solder balls is arranged as a circular boundary around the first signal launch and the through-hole cavity.

7. The device of claim 2, wherein the first set of grounded solder balls is arranged as a rectangular boundary around the first signal launch and the through-hole cavity.

8. The device of claim 1, wherein the first and second sets of grounded solder balls have at least one grounded solder ball in common.

9. The device of claim 1, wherein the first and second sets of grounded solder balls have no grounded solder balls in common.

10. The device of claim 1, wherein the first and second sets of grounded solder balls are arranged such that the first and second signals are isolated from each other by a threshold amount.

11. A printed circuit board (PCB), comprising:
 a PCB substrate having a first surface and a second surface opposite the first surface, the PCB substrate further having a first through-hole cavity from the first surface to the second surface and a second through-hole cavity from the first surface to the second surface;
 an integrated circuit (IC) package substrate comprising a first signal launch on a surface of the IC package substrate and a second signal launch on the surface of the IC package substrate;
 a first wave-guiding interface comprising a first set of grounded solder balls and coupling the IC package substrate to the first surface of the PCB substrate such that the surface of the IC package substrate faces the first surface of the PCB, and a second wave guiding interface comprising a second set of grounded solder balls;
 an external antenna comprising a first waveguide and a second waveguide and coupled to the second surface of the PCB substrate;
 a first signal channel between the first signal launch and the external antenna comprising:
  the first wave-guiding interface,
  the first through-hole cavity, and
  the first waveguide, wherein the first signal launch, the first through-hole cavity, and the first waveguide are substantially aligned, and wherein a shape of a cross section of the first signal channel is defined by a fence around the first signal launch comprising the first set of grounded solder balls; and
 a second signal channel between the second signal launch and the external antenna comprising the second wave-guiding interface, the second through-hold cavity, and the second waveguide, wherein:
  the second signal launch, the second through-hold cavity, and the second waveguide are substantially aligned; and
  a shape of a cross section of the second signal channel is defined by a fence around the second signal launch comprising the second set of grounded solder balls.

12. The PCB of claim 11, further comprising a ball grid array (BGA) affixed to the surface of the IC package substrate and coupling the IC package substrate to the first surface of the PCB substrate, wherein the BGA comprises the first wave-guiding interface.

13. The PCB of claim 11, wherein the shape of the cross section of the first signal channel is circular, and wherein the first set of grounded solder balls are arranged in a circular fence around the first signal launch.

14. The PCB of claim 11, wherein the shape of the cross section of the first signal channel is rectangular, and wherein the first set of grounded solder balls are arranged in a rectangular fence around the first signal launch.

15. An integrated circuit (IC) chip, comprising:
 a radar device comprising a first signal launch and a second signal launch on a surface of the radar device; and
 a first wave-guiding interface comprising a first set of grounded solder balls arranged as a fence around the first signal launch on the surface of the radar device, and a second wave-guiding interface comprising a second set of grounded solder balls arranged as a fence around the second signal launch on the surface of the radar device.

16. The IC chip of claim 15, wherein the first wave-guiding interface defines a shape of a cross section of a first signal channel corresponding to the first signal launch.

17. The IC chip of claim 15, further comprising a ball grid array (BGA) package encapsulating the radar device and comprising the first set of grounded solder balls included in the first wave-guiding interface and the second set of grounded solder balls included in the second wave guiding interface.

18. The IC chip of claim 15, wherein the IC chip is coupled to a PCB substrate having:
 a first surface;
 a second surface opposite the first surface; and
 a substrate through-hole waveguide from the first surface to the second surface, wherein the first set of grounded solder balls couples the radar device to the first surface such that the surface of the radar device faces the first surface and such that the first signal launch and the substrate through-hole waveguide are substantially aligned.

19. The IC chip of claim 18, wherein an external antenna is coupled to the second surface of the PCB substrate and comprises a waveguide opening, wherein the first wave-guiding interface, the substrate through-hole waveguide, and the waveguide opening form a signal channel between the first signal launch and the external antenna.

20. The IC chip of claim 19, wherein a shape of a cross section of the signal channel is defined by the first set of grounded solder balls arranged as the fence around the first signal launch.

* * * * *